(12) United States Patent
Lopez

(10) Patent No.: US 10,608,140 B2
(45) Date of Patent: Mar. 31, 2020

(54) LED WITH PATTERNED SURFACE FEATURES BASED ON EMISSION FIELD PATTERNS

(71) Applicant: KONINKLIJKE PHILIPS N.V., Eindhoven (NL)

(72) Inventor: Toni Lopez, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/730,459

(22) Filed: Oct. 11, 2017

(65) Prior Publication Data

US 2018/0033916 A1 Feb. 1, 2018

Related U.S. Application Data

(63) Continuation of application No. 14/900,143, filed as application No. PCT/IB2014/062150 on Jun. 12, 2014, now Pat. No. 9,876,141.

(60) Provisional application No. 61/836,775, filed on Jun. 19, 2013.

(51) Int. Cl.
*H01L 33/24* (2010.01)
*H01L 33/20* (2010.01)
*H01L 33/00* (2010.01)
*H01L 33/22* (2010.01)
*H01L 33/46* (2010.01)

(52) U.S. Cl.
CPC .......... *H01L 33/24* (2013.01); *H01L 33/0062* (2013.01); *H01L 33/20* (2013.01); *H01L 33/22* (2013.01); *H01L 33/46* (2013.01)

(58) Field of Classification Search
None
See application file for complete search history.

(56) References Cited

U.S. PATENT DOCUMENTS

| | | |
|---|---|---|
| 2002/0141006 A1 | 10/2002 | Pocius et al. |
| 2005/0221527 A1 | 10/2005 | Yeh et al. |
| 2005/0225988 A1 | 10/2005 | Chaves et al. |
| 2006/0175625 A1 | 8/2006 | Yokotani et al. |

(Continued)

FOREIGN PATENT DOCUMENTS

| | | |
|---|---|---|
| CN | 101582479 A | 11/2009 |
| DE | 102010020789 A1 | 11/2011 |

(Continued)

OTHER PUBLICATIONS

EP Office Action dated Jun. 29, 2018, European Patent Application No. 14734234.9, 7 pages.

(Continued)

*Primary Examiner* — Matthew L Reames

(57) ABSTRACT

The escape surface of a light emitting element includes features that include sloped surfaces that have angles of inclination that are based on the direction of peak light output from the light emitting element. If the light output exhibits a number of lobes at different directions, the sloped surfaces may have a corresponding number of different angles of inclination. To minimize the re-injection of light into adjacent features, adjacent features may be positioned to avoid having surfaces that directly face each other. The features may be shaped or positioned to provide a pseudo-random distribution of inclined surfaces across the escape surface, and multiple roughening processes may be used.

6 Claims, 6 Drawing Sheets

(56) References Cited

U.S. PATENT DOCUMENTS

| | | |
|---|---|---|
| 2006/0278888 A1 | 12/2006 | Kim et al. |
| 2008/0142814 A1 | 6/2008 | Chu et al. |
| 2008/0149959 A1 | 6/2008 | Nakamura et al. |
| 2008/0237616 A1 | 10/2008 | Hatagoshi et al. |
| 2009/0261318 A1 | 10/2009 | Cheong |
| 2009/0315055 A1 | 12/2009 | Tamboli et al. |
| 2011/0062414 A1 | 3/2011 | Wang |
| 2011/0198560 A1 | 8/2011 | Okagawa et al. |
| 2012/0214267 A1 | 8/2012 | Wang et al. |
| 2012/0292629 A1 | 11/2012 | Wu et al. |
| 2012/0305965 A1 | 12/2012 | Tseng et al. |
| 2013/0161643 A1 | 6/2013 | Crowder |
| 2013/0193450 A1 | 8/2013 | Bergbauer et al. |
| 2013/0228808 A1 | 9/2013 | Lester |
| 2013/0234179 A1 | 9/2013 | Yamada et al. |
| 2013/0285109 A1 | 10/2013 | Narita et al. |
| 2014/0014974 A1* | 1/2014 | Chang .............. H01L 33/20 257/79 |
| 2014/0312373 A1 | 10/2014 | Donofrio |
| 2014/0313697 A1* | 10/2014 | Kim .............. G02B 3/0056 362/97.1 |

FOREIGN PATENT DOCUMENTS

| | | |
|---|---|---|
| EP | 2587556 A1 | 5/2013 |
| EP | 2602836 A1 | 6/2013 |
| JP | 2007317916 A | 12/2007 |
| JP | 2008244111 A | 10/2008 |
| TW | M420049 U | 1/2012 |
| WO | 03100873 A1 | 12/2003 |
| WO | 2013001781 A1 | 1/2013 |

OTHER PUBLICATIONS

EPO as ISA, PCT/IB2014/062150, filed Jun. 12, 2014, "International Search Report and Written Opinion" dated Sep. 16, 2014, 11 pages.
First Office Action dated Jun. 29, 2017 from Chinese Patent Application 201480035017.0, 16 pages.
Office Action dated Mar. 6, 2018, Japanese Patent Application No. 2016-520777, 8 pages.
Second Office Action dated Mar. 29, 2018, China Patent Application No. 201480035017.9, 7 pages.
Taiwan Office Action dated Nov. 28, 2017, Taiwan Application No. 103121268, 9 pages.
CN Third Office Action dated Nov. 23, 2018, China Patent Application No. 201480035017.9, 18 pages.
JP Office Action dated Sep. 25, 2018, Japan Application No. 2016-520777, 8 pages.
Article 94(3)EPC dated Jul. 4, 2019, European Patent Application No. 14734234.9, 19 pages.
CN Fourth Office Action dated May 13, 2019, Chinese Patent Application No. 201480035017.9, 12 pages.
Decision of Refusal dated May 7, 2019 for Japanese Patent Application No. 2016-520777, 4 pages.
Dismissal of Amendment dated May 7, 2019 for Japanese Patent Application No. 2016-520777, 4 pages.

* cited by examiner

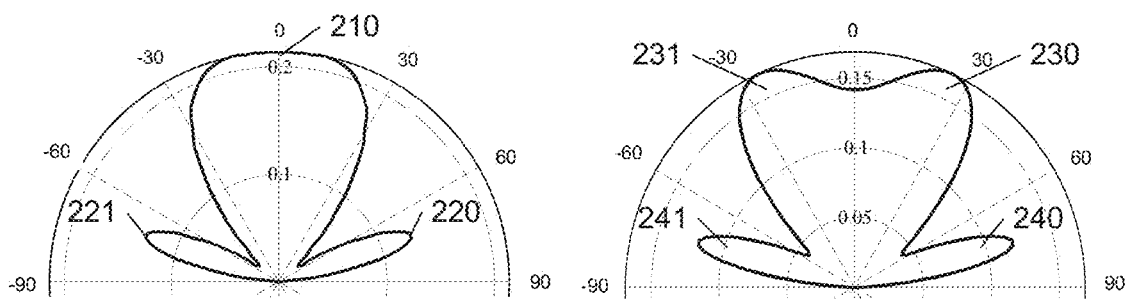
FIG. 2A
FIG. 2B
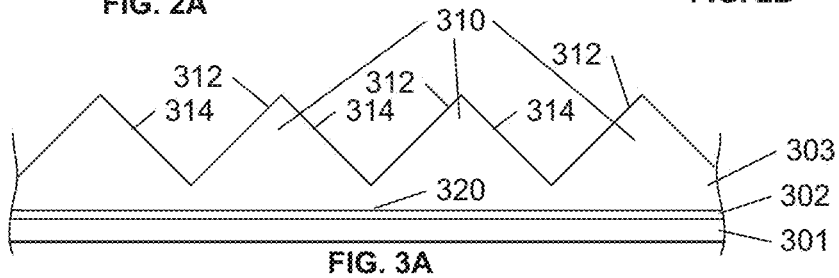
FIG. 3A
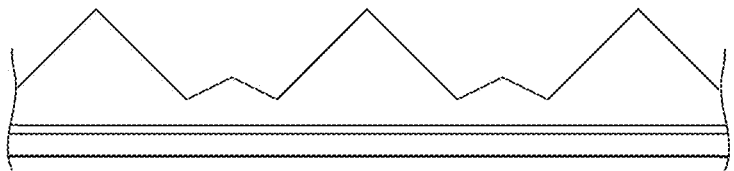
FIG. 3B
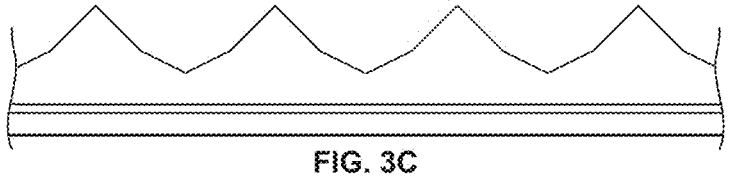
FIG. 3C
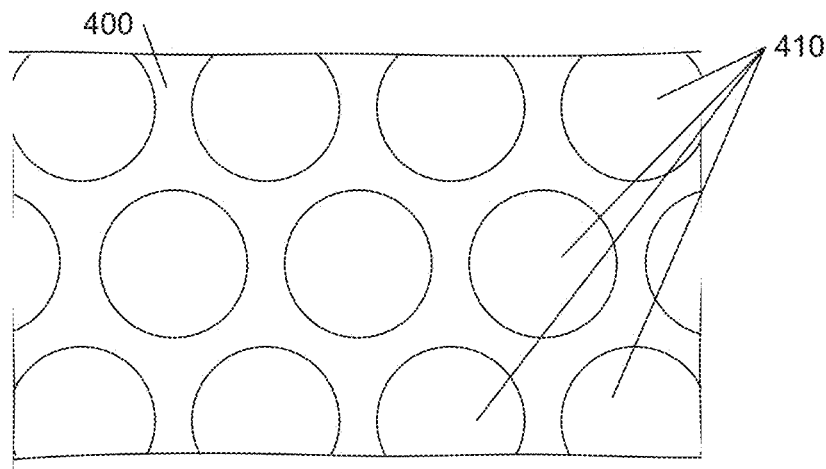
FIG. 4A
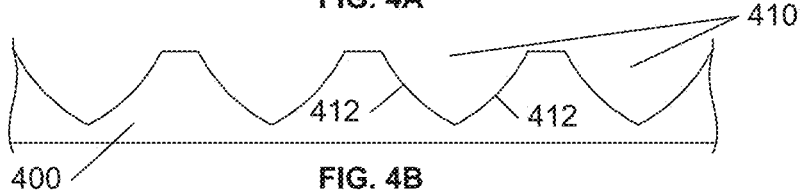
FIG. 4B

LED WITH PATTERNED SURFACE FEATURES BASED ON EMISSION FIELD PATTERNS

CROSS-REFERENCE TO RELATED APPLICATIONS

The present application is a continuation of U.S. patent application Ser. No. 14/900,143 filed on Dec. 18, 2015, and titled "LED WITH PATTERNED SURFACE FEATURES BASED ON EMISSION FIELD PATTERNS," which is a § 371 application of International Application No. PCT/IB2014/062150 filed on Jun. 12, 2014, which claims the benefit of U.S. Provisional Patent Application No. 61/836,775 filed on Jun. 19, 2013. U.S. patent application Ser. No. 14/900,143, International Application No. PCT/IB2014/062150, and U.S. Provisional Patent Application No. 61/836,775 are incorporated herein.

FIELD OF THE INVENTION

This invention relates to the field of optics, and in particular to the creation of patterns on a light-extraction surface, such as a surface of a light-emitting device.

BACKGROUND OF THE INVENTION

A conventional semiconductor light emitting element includes a double heterostructure that includes a light emitting ('active') layer that is sandwiched between an N-type clad layer and a P-type clad layer. When charge-carriers (electrons and holes) flow into the active layer, these charge-carriers may meet. When an electron meets a hole, it falls into a lower energy level, and releases energy in the form of a photon. The created photon may travel in any direction, and commercially available light emitting elements typically include reflective surfaces that redirect light so as to exit an intended escape surface of the light emitting element. However, the light may strike the escape surface at virtually any angle, and a substantial portion of the light may strike the surface at an angle that exceeds a critical angle of the interface between the materials on either side of the surface and be totally internally reflected (TIR).

The critical angle is determined by the indices of refraction $n1$ and $n2$ of the material at an interface between the materials, and is equal to:

$$\arcsin(n2/n1), \quad \text{(Equation 1)}$$

for light traveling from the medium having an index of refraction $n1$ into a medium having an lower index of refraction of $n2$. Light that strikes the surface at greater than the critical angle will be totally internally reflected, and will not escape through the surface. The term "escape zone", or "escape cone" is used to define the range of angles within which light will escape through the surface. The escape cone at any point on the surface is a cone with an apex at the surface whose cross-section subtends an angle of twice the critical angle about a normal to the surface. The escape zone is the composite of the escape cones of all points on the surface.

Although escape zones are defined by solid angles, this disclosure is presented using a two-dimension model, for ease of presentation and understanding. One of skill in the art will recognize that the conclusions drawn from the following analysis of two dimensional optical models are applicable to a more complex analysis using a three-dimensional model.

It has been determined that roughening the escape surface allows more light to escape through the surface, compared to a smooth surface. When light is totally internally reflected from the smooth escape surface, it will travel back toward the interior of the light emitting element, be reflected by the reflective surfaces, and redirected back toward the escape surface. In most cases, this process is repeated until the reflected light is fully absorbed inside the LED. Conversely, because a roughened surface will have portions of its surface at varying angles relative to the surface of the active area, some of the light that would have been outside the escape zone of a smooth escape surface will be within the escape zone of a sloped surface of the roughened surface and will exit the roughened escape surface; additionally, some of the light that may be reflected from the roughened escape surfaces may be redirected in the desired direction (e.g. orthogonal to the active layer), so that on the next bounce, the likelihood of exiting the escape surface is increased.

The escape surface of the light emitting element may be roughened using any of a variety of techniques, some of which create a randomly roughened surface, and some of which create a surface with a particular pattern of grooves, crevices, structures, and the like. In "Recent Progress of GaN Based High Power LED" ($14^{th}$ Optoelectronics and Communication Conference, 2009), Hao-chung Kuo discloses a combination of roughening techniques wherein the escape surface is first patterned, then subjected to a random roughening process, creating an escape surface having a roughened pattern.

Although roughening the escape surface improves the light extraction efficiency, some of this efficiency is lost when light that exits a feature on the roughened escape surface strikes an adjacent feature and is 're-injected' into the light emitting element. Additionally, in a random roughening process, control of the shape and density of the created features is somewhat limited, and hence, the likelihood of light exiting the surface, and the likelihood of light being re-injected into the surface, is difficult to control or predict.

SUMMARY OF THE INVENTION

It would be advantageous to further improve the light extraction efficiency of an escape surface of a light emitting element. It would also be advantageous to use a patterned surface that is featured to increase the light extraction efficiency based on the particular characteristics of the light source of the light emitting element.

To better address one or more of these concerns, in an embodiment of this invention, the escape surface of a light emitting element includes a plurality of features, each feature having a plurality of surfaces that have angles of inclination that are based on the direction(s) of peak light output from the light source. If the light output exhibits a number of lobes at different directions, the plurality of surfaces may have a corresponding number of different angles of inclination. To minimize the re-injection of light into adjacent features, adjacent features may be positioned to avoid having surfaces that directly face each other.

In particular, a light emitting element emits light with a particular emission field pattern, and includes an escape surface from which the light is emitted. To improve light extraction efficiency, the escape surface includes surface features that include sloped surfaces with slopes that are dependent upon the particular angular emission field pattern of the light emitting element. The surface features may include, for example, conic or pyramid features having slopes that maximize the amount of light that is able to escape the escape surface. The surface features may be formed by etching, milling, or laser slicing.

The interface between the sloped surfaces and an exterior medium exhibits a critical angle that defines an escape zone outside of which light is totally or mostly internally reflected, and the slopes are determined to maximize an amount of light that strikes the sloped surfaces within the escape zone.

The far field angular emission field pattern may include a plurality of lobes, and the slopes of the features on the escape surface are determined based on the polar orientation of these lobes. In some embodiments, different surface features may be created to provide sloped surfaces with different slopes, the different slopes being dependent upon the different lobes that may be present in the particular emission field pattern.

To minimize the likelihood of emitted light re-entering the light emitting element, the surface features are arranged on the surface such that none of the sloped surfaces of a surface feature directly face any sloped surfaces of a neighboring surface feature. For example, in some embodiments, each sloped surface of a surface feature faces an edge of a neighboring surface feature.

In like manner, if a particular process provides for the efficient creation of particular surface features, or if particular surface features are known to provide high extraction efficiency and low re-insertion likelihood, the elements of the light emitting device may be arranged to produce an angular emission field pattern that realizes optimal or near-optimal light extraction efficiency through these particular surface features.

In some embodiments, the surface features of the roughened surface and the angular emission field pattern of the light emitting element are designed in unison to provide for a light emitting element with high light extraction efficiency.

BRIEF DESCRIPTION OF THE DRAWINGS

The invention is explained in further detail, and by way of example, with reference to the accompanying drawings wherein:

FIGS. 2A-2B illustrate example polar plots of light emission fields.

FIGS. 3A-3C illustrate example surface pattern profiles based on peaks in the light emission fields.

FIGS. 4A-4B illustrate example surface features formed as conic features.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

As noted above, a conventional light emitting element may include a reflective surface that reflects light from the active layer toward the escape surface. The photon radiation from an active layer near a silver mirror exhibits the characteristics of an electric dipole in the vicinity of a metal plane. The resultant far field radiation pattern will be dependent upon the distance between the active layer and the mirror relative to the wavelength of the emitted light, as well as the refractive index of the material through which the light travels. Given a distance D between the active layer and the mirror, a relative distance d may be defined as:

$$d = \eta * D/\lambda, \quad \text{(equation 2)}$$

where:

$\eta$ is the index of refraction of the material between the active layer and the mirror; and $\lambda$ is the wavelength of the emitted light.

Figure 1:
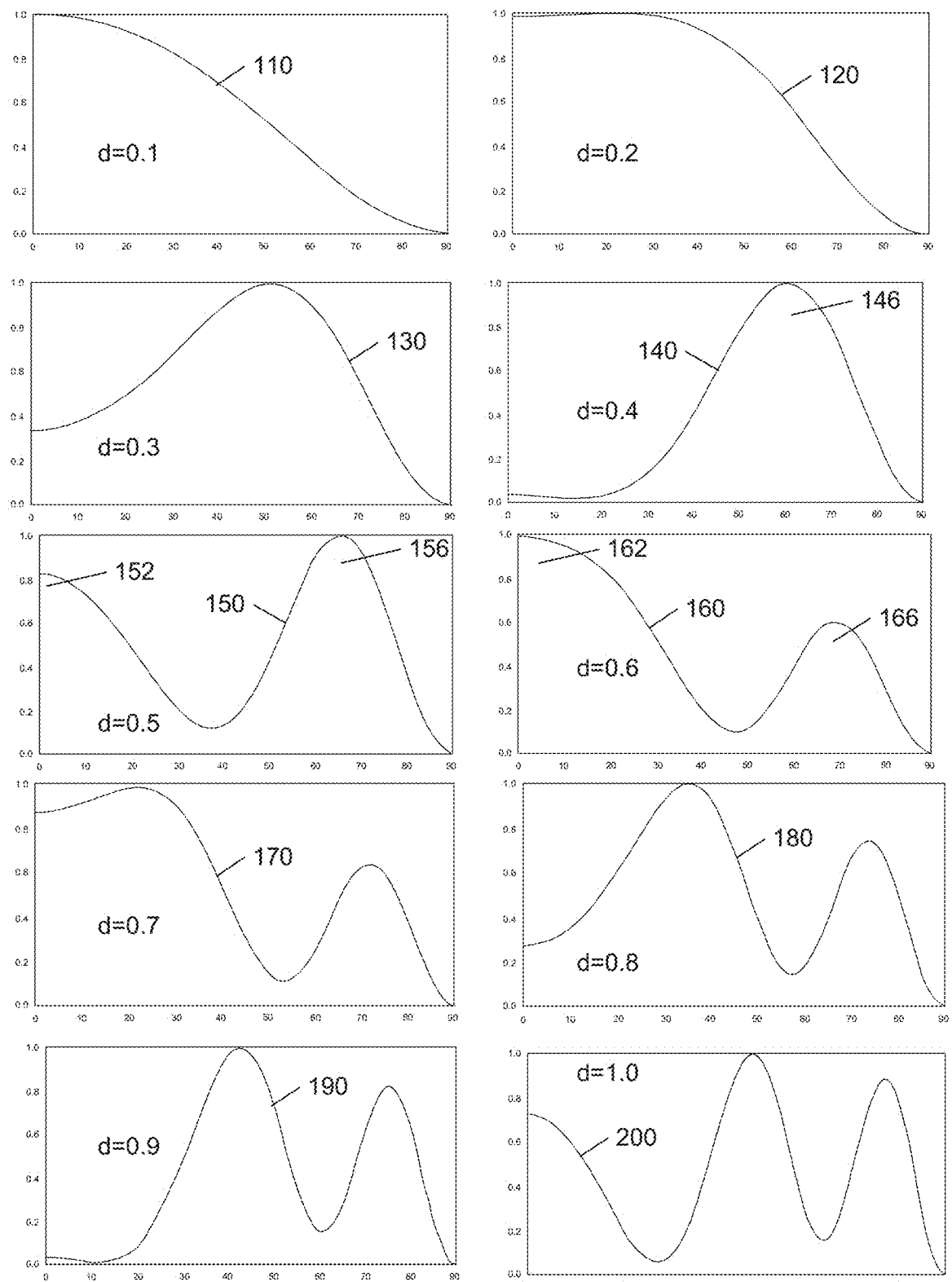
FIG. 1 illustrates an example set of light emission field patterns for various distances between the light emitting layer and a reflector.

FIG. 1 illustrates an example set of normalized far field emission patterns 110-200 for different values of the relative distance d between the active layer and the mirror. In this example, the material between the active layer and the mirror is GaN, and the mirror is a silver reflector. The vertical axis represents the normalized emission magnitude, and the horizontal axis represents the angle relative to a normal to the light emitting surface.

As can be seen, when the mirror is very close to the active layer (d=0.1), the emission pattern is not significantly different from a Lambertian pattern, with a peak emission levels at angles at or near normal to the surface, and progressively lower emission levels as the angle increases away from normal. As the relative distance increases, the travel through the increased distance D allows for interactions that create increasingly complex patterns.

As the relative distance increases from 0.1 to 0.4, less light is emitted in the normal direction. As can be seen, in the pattern 140 produced when the relative distance is 0.4 (D=0.4*$\lambda/\eta$), there is very little emission in directions at or near normal, and a large amount of emission 146 in directions at or near 60 degrees off normal. As the relative distance increases further, toward a relative distance of 0.6 (D=0.6*$\lambda/\eta$), multiple peaks (152, 156), (162, 166) are produced as the amount of light emitted in the normal direction increases. As the relative distance is further increased, the multiple peaks are offset further from normal, and additional peaks are formed.

Note that different patterns may be produced under different circumstances. For example, the patterns illustrated in FIG. 1 are patterns that may be produced assuming near-perfect reflection from the mirror; in reality, mirror surfaces are rarely perfect reflectors. Additionally, various other parameters may affect the emission field pattern. FIGS. 2A and 2B illustrate two different emission field patterns for two models of a light emitting device with different parameters taken into account. FIG. 2A illustrates a predicted emission field pattern using a 'simple' model, corresponding, for example, to the pattern 160 of FIG. 1, while FIG. 2B illustrates a more complex model of the same light emitting device.

FIGS. 2A and 2B provide a 'polar' representation of the far field emission field pattern, wherein the loci of points on the semi-circle represents the angles relative to the surface of the light emitting layer, and the distance from the origin represents the amplitude of the emissions at the particular angle. In such a representation, emissions about a peak emission amplitude appear as "lobes". In FIG. 2A, three lobes 210, 220, 221 are indicated, although in three-dimensional space, lobes 220 and 221 are cross sections of the same 'solid angle lobe' having an angular orientation of about 70 degrees. In FIG. 2B, four lobes 230, 240, 231, 241 are indicated, corresponding to two solid angle lobes at peak emission angles of about 30 degrees and 70 degrees. For ease of reference, the term 'lobe' is used hereinafter to indicate 'emissions about a peak emission angle'.

The examples of FIGS. 1 and 2A-2B are merely intended to illustrate that, depending on the fabrication technique and parameters, conventional light emitting devices may exhibit non-Lambertian emission patterns. As will be evident below, this invention is not limited to the use of the dipole-mirror effect to introduce any particular emission pattern; rather, it will be apparent to one of skill in the art that this invention is not dependent upon any particular technique used to create the particular emission field pattern.

Although the example of FIG. 1 illustrates that the far field emission field pattern may be controlled by controlling the distance between the reflector and the active layer, so that off-normal peaks can be avoided if desired, in many instances, the fabrication process is constrained by factors that do not allow for control of the emission field pattern, per se. Any particular fabrication technique, however, will generally produce a corresponding particular emission field pattern, and testing may be performed to determine the particular emission field pattern (or set of lobes) of devices produced by the given technique.

In an embodiment of this invention, the emission field pattern of a given light emitting device, or class of light emitting devices, is determined, and the escape surface of the light emitting device is patterned, based on the determined emission field pattern, to reduce the total internal reflection (TIR) at the surface caused by light striking the surface at angles greater than the critical angle off normal to the escape surface.

In other embodiments of this invention, the angular light extraction efficiency of a given set of escape surface features is determined, and the emission field pattern of a light emitting element is designed based on the determined angular light extraction efficiency. In some embodiments, the escape surface features and the emission field pattern are designed in unison to achieve a high light extraction efficiency. For ease of reference and presentation, the following disclosure is presented using the paradigm of designing the escape surface features to optimize the light extraction efficiency for a given emission field pattern. One of skill in the art will recognize that the principles presented using this paradigm are applicable to the other above-mentioned design sequences.

Also for ease of reference and presentation, the following examples are presented using the aforementioned two-dimensional model of the emission field patterns, and using an idealized model of total internal reflection wherein all light within the escape zone exits the surface, and all light outside the escape zone is totally internally reflected.

FIG. 3A illustrates an example surface profile with features 310 each of which includes sloped surfaces 312, 314. In this profile, a light emitting region 302 is sandwiched between n-type and p-type regions 301, 303. The sloped surfaces 312, 314 are formed in region 303. A mirror 316 is formed at a distance D below light emitting region 302. One of skill in the art will recognize that each of these regions 301, 302, 303 may include multiple layers of materials, including contacts and the like (not illustrated).

In this example, the sloped surfaces 312, 314 are at a 45 degree angle relative to the surface 320 of the light emitting region 302. Light that is emitted from the surface 320 at 45 degrees will strike one of the sloped surfaces 312, 314 at an angle that is normal to the sloped surface, and will exit the surface. Of particular note, the critical angle at the sloped surfaces 312, 314 will be relative to the normal of these surfaces 312, 314, which is at a 45 degree angle from the normal to the light emitting surface 320.

Light that is emitted at 30 degrees off normal from the light emitting surface 320 will strike one of the sloped surfaces 312, 314 at an angle of 15 degrees, as will light that is emitted at 60 degrees. If the critical angle is at least 15 degrees, light emitted at angles between 30 and 60 degrees that strikes the surfaces 312, 314 will exit these surfaces. Contrarily, light that is emitted at 0 degrees (normal to the light emitting layer) will strike the surfaces 312, 314 at an angle of 45 degrees, and may be totally internally reflected if the critical angle is less than 45 degrees. In embodiments of this invention, the slope of the sloped surfaces 312, 314 may be determined so as to minimize the amount of light that is totally internally reflected, based on the emission pattern of the light emitted within the light emitting device.

If a light emitting device is determined to exhibit an emission pattern similar to the pattern 140 in FIG. 1, for example, a significant amount of light will be emitted at angles at or near 60 degrees off normal (i.e. a lobe is present at about 60 degrees, and −60 degrees, in the two dimensional 'cross section' of the three-dimensional emission pattern; in three dimensions, this lobe is revolved about an axis orthogonal to the light emitting surface). If the escape surface is parallel to the surface of the light emitting layer, and the critical angle of the escape surface is, for example, 40 degrees, a substantial portion of the emitted light will be outside of the escape zone of the escape surface, and will be totally internally reflected when it strikes the escape surface.

To increase the amount of light that will exit the escape surface, the surface may be patterned to create surface features that provide escape zones that encompass a significant portion of the emitted light. For example, if as in the above example, a lobe is present at 60 degrees off normal to the light emitting surface, features may be created on the surface that present surface areas that are sloped 60 degrees relative to the plane of the light emitting surface. With such a sloped surface, the center of the escape zone will be oriented in the same direction as the peak of the lobe at 60 degrees, and light that strikes this sloped surface within 60 degrees+/−the critical angle will be able to escape through the sloped surface. Since a significant amount of the emitted light will be at an angle of 60 degrees+/−the width of the lobe, a significant amount of the emitted light within the lobe that strikes the sloped surface will escape through the sloped surface.

If, as in the above example, the critical angle is 40 degrees, the light that is emitted above 20 degrees and strikes the surface feature that is sloped at 60 degrees will exit the escape surface. As illustrated in FIG. 1, if a device exhibits a pattern similar to pattern 140, almost all of the emitted light is emitted at angles above 20 degrees. Accordingly, almost all of the emitted light that strikes the surface feature is able to exit the escape surface.

Figure 13:
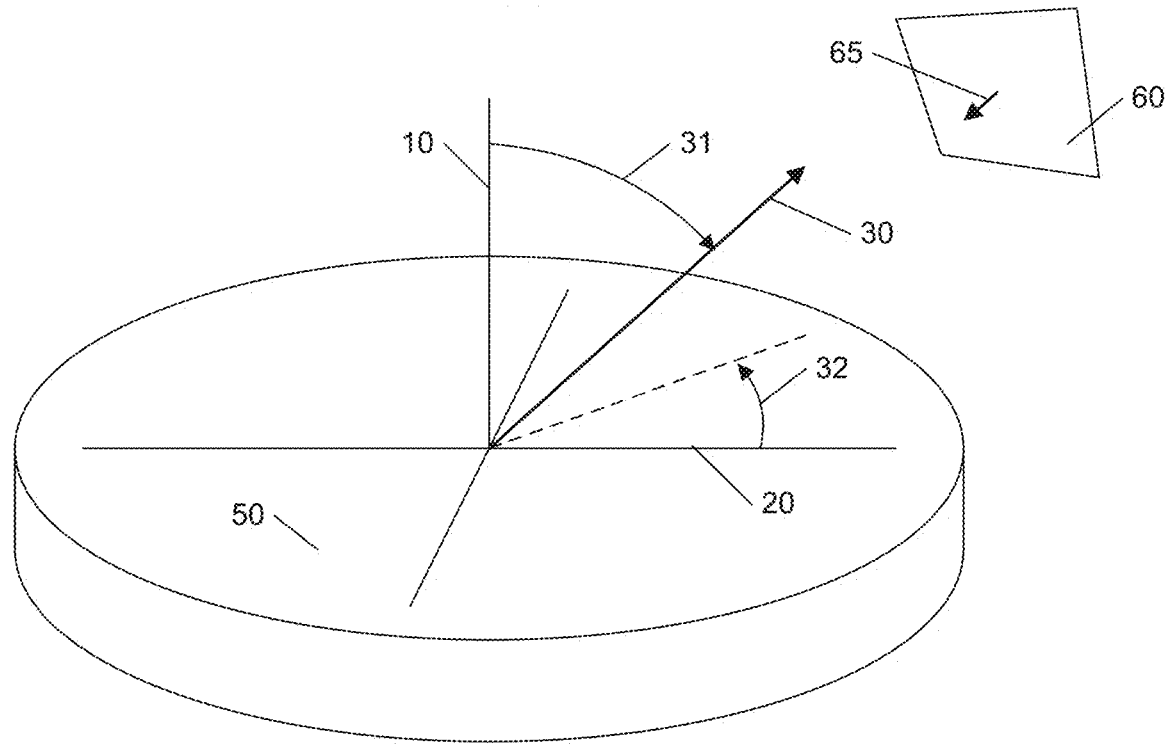
FIG. 13 illustrates an example light emitting surface and sloped feature.

One of skill in the art will recognize that the emitted light is emitted in a direction relative to three dimensions, and the direction of an emission may be referenced by angles with respect to two orthogonal axes in this three-dimensional system, as illustrated in FIG. 13. In this example, emitted light 30 is at an angle 31 relative to axis 10, which is normal to the light emitting surface 50, consistent with the angles referenced in FIGS. 1 and 2. The other angle 32 is an angle relative to a reference line (axis) 20 on the light emitting surface 50. In like manner, the orientation of a sloped surface 60 may be referenced with respect to these same two axes. That is, in addition to being sloped with regard to a normal 10 to the light emitting surface 50, the surface 60 will also 'face' the light emitting surface from a given direction relative to the axis 20 on the light emitting surface.

With regard to the escape zone of the sloped surface 60, the angle of intersection of emitted light 30 upon the sloped surface 60 will be relative to a normal axis 65 that is orthogonal to the sloped surface 60 and will be a composite of the emission angles and slope angles with respect to the axes of the light emitting surface. Additionally, if the sloped surface is curved, the normal 65 will vary across the curved surface. Light that strikes a point on the sloped surface 60 will escape only if this composite angle of intersection with respect to the normal 65 at the point is within the escape zone of the sloped surface 60.

Simulation and analysis systems are commonly available for determining whether light from a given 3D direction will exit a surface oriented at another direction based on the critical angle relative to a normal to the surface. However, as noted above, for ease of explanation and understanding, the principles of this invention are presented using the aforementioned two-dimensional orientation of the surface features relative to the plane of the emitting surface. One of skill in the art will recognize that a three-dimensional analysis will follow along the same principles; except that the angles of intersection will be based on a three dimensional model such as illustrated in FIG. 13.

Returning to the two-dimensional analysis, it should be noted that the sloped surface need not be strictly perpendicular to the angle of lobes. In the example above, with a critical angle of 40 degrees, and a peak emission angle of 60 degrees, a surface that is sloped at 50 degrees will allow all of the light that is emitted at angles above 10 degrees and strikes the surface to exit the escape surface; a surface that is sloped at 45 degrees will allow the light that is emitted between 5 and 85 degrees (45+/−the critical angle) to exit. The particular slope of the surface is preferably selected to optimize the amount of emitted light that will exit that surface, based on the amount of light that is included within the escape zone of the sloped surface from the emission field pattern for the light emitting device.

If, for example, the light emitting device exhibits a pattern similar to pattern 130 of FIG. 1, wherein the peak/lobe occurs at about 55 degrees, it is noted that substantially more light is emitted at angles less than 55 degrees than at angles greater than 55 degrees. Accordingly, the escape zone of the surface may be biased toward the angles of greater emissions, such as to 45 degrees, even though the peak/lobe occurs at about 55 degrees. In this manner, although some of the light at the higher angles of the lobe may not be included in the escape zone of this lesser sloped surface, the potentially greater amount of light that is emitted at the lower angles of the lobe may be expected to be included in the escape zone and will consequently exit the escape surface.

Using pattern 130 and a critical angle of 40 degrees again as the example, the amount of light emitted between 70 and 80 degrees appears to be less than the amount of light emitted between 0 and 10 degrees. Accordingly, if the feature surface is sloped at 30 degrees, the escape zone can be expected to allow light emitted at angles between −10 degrees and +70 degrees that strike the surface to exit the escape surface, whereas light emitted above 70 degrees will not be within the escape zone, and will be internally reflected. Since, in this two-dimensional example, the amount of light emitted between 0 and −10 degrees is greater than the amount of light emitted between 70 and 80 degrees, more emitted light will strike the feature surface within the critical angle and be able to exit the escape surface.

Contrarily, the amount of light emitted between 10 and 20 degrees does not appear to be greater than the amount of light emitted between 60 and 70 degrees. Accordingly, setting the feature slope at 20 degrees, so that the escape zone includes the light emitted between 10 and 20 degrees, and excludes the light emitted between 60 and 70 degrees, will not increase the total amount of light that will be within the escape zone of the sloped surface, and, in this two-dimensional example, will reduce the amount of light that exits the surface, compared to a feature slope at 30 degrees. As noted above, the actual amount of emitted light that will be included within the escape zone will be dependent upon the three-dimensional orientation of the feature slope relative to the given emission pattern. The above two-dimensional example is used merely to illustrate that a maximum amount of light may be included within an escape zone that is not aligned with the particular angle of maximum emissions, particularly if the emission pattern is not symmetric about this angle of maximum emissions.

One of skill in the art will recognize that a combination of differently sloped surfaces may be provided to optimize the amount of light that will be included within the escape zones of these surfaces. For example, with the example emission pattern 120 and an example critical angle of 40 degrees, a significant portion of the emitted light is emitted at angles less than 40 degrees. Accordingly, the escape cone of a surface that is parallel to the emitting surface will include all of this emitted light at less than 40 degrees, and thus some of the exit surface can be left 'unfeatured' (flat) to enable this light to escape. To allow light at greater than 40 degrees to exit the surface, features may be provided with slopes at, for example, 50 degrees, so that the escape zone at these sloped surfaces will encompass light that is emitted within 10 and 90 degrees.

In like manner, if the emission pattern exhibits multiple peaks/lobes, a combination of sloped surfaces may be provided corresponding to these lobes to substantially increase the amount of light that is able to exit the escape surface, as illustrated in the example profile of FIGS. 3B and 3C. As in the single feature surface example above, the slopes of the multiple surfaces may be selected to optimize the total amount of light that can be expected to strike the surface features within their critical angles. However, in this determination, it should be noted that areas of the surface that are sloped for one lobe may adversely affect the light emitted within the other lobe.

In some embodiments, the proportion of surface area with a given slope may be proportional to the power associated with the lobe corresponding to that slope. For example, if a main lobe provides 80% of the total power, and another lobe provides 20% of the total power, 80% of the escape surface area may include features with a slope designed to maximize the extraction of light from the main lobe, and 20% of the escape surface may include features with a slope designed to maximize the extraction of light from the other lobe.

Heuristic techniques may be used to determine a set of slopes that are likely to be efficient for a given emission field pattern, generally based on a preference for fewer and slighter slopes. Alternatively, conventional modeling techniques may be applied to determine an optimal number and slopes of these surface features, based on the expected, predicted, or known emission field pattern associated with the light emitting device.

The features of FIGS. 3A-3C may be provided using any of a variety of techniques. The profiles of FIGS. 3A-3C may represent, for example, the profile of a plurality of concentric grooves viewed along a diagonal cross section. In like manner, the profiles of FIGS. 3A-3C may represent the profile of an array of cones formed on the escape surface. One of skill in the art will recognize that the profiles of FIGS. 3A-3C may represent other shapes as well.

The size of the features may vary in width and height. In some embodiments, the features are between 1 um and 10 um in width and between 1 um and 10 um in height.

FIGS. 4A, 4B illustrate a top view and profile view, respectively, of a portion of an example escape surface 400 that includes features 410. In this example, the features 410 are an array of conic pits arranged in a periodic, or pseudo-period pattern. The predominant slope of the walls 412 of the features 410 is created based on the emission field pattern of the light emitting device, as detailed above. The pits may be formed by a patterned etching of the surface 400, and the predominant slope of the walls 412 may be controlled by the particular etching characteristics of the etchant that is used. For example, a fast-acting etchant may create a steeper slope than a slower-acting etchant. In like manner, the slope may vary based on the diameter of the feature 410, as well as the environmental conditions during the etching process.

The pattern of features 410 may vary. In some embodiments, the average center-to-center spacing ('pitch') is less than twice the diameter of the feature 410, however, the desired ratio of unfeatured (flat) areas to featured areas of the surface may lead to a larger pitch.

One of skill in the art will recognize that the features 410 could as well be conic structures, rather than conic pits.

Figure 5A:
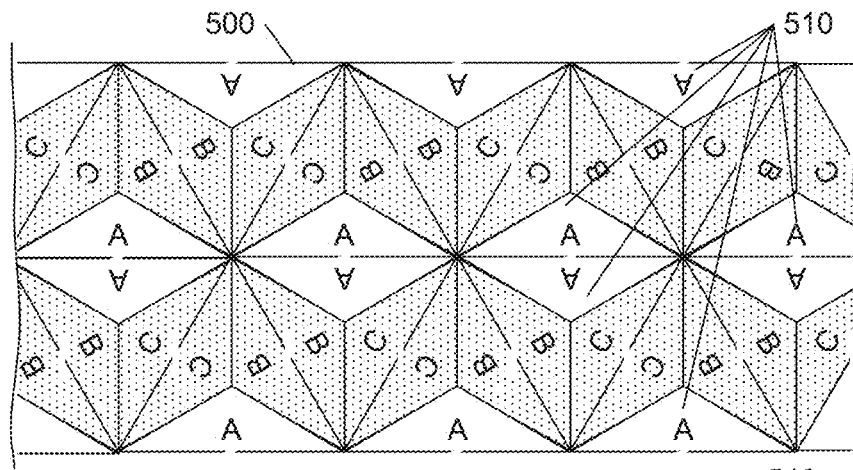
FIGS. 5A-5B illustrate example surface features formed as pyramid features.
Figure 5B:
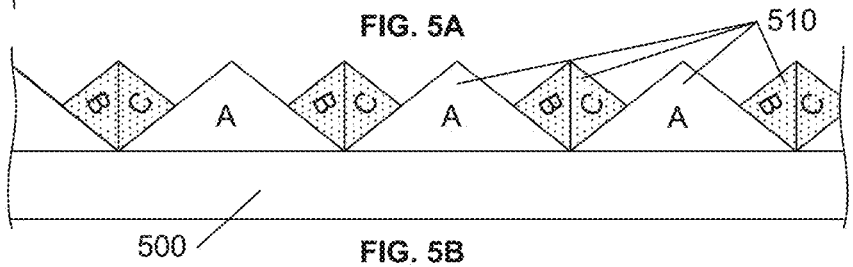

FIGS. 5A, 5B illustrate a top view and profile view, respectively, of a portion of an example escape surface 500 that includes features 510. In this example, the features 510 are an array of pyramids, with sloped surfaces A, B, C. As detailed above, the slope of the surfaces A, B, C may be determined based on the emission field pattern of the light emitting device, preferably to reduce the amount of light that will be totally internally reflected at these surfaces. As in the example of FIGS. 4A-4B, patterned etching may be used to create these features 510.

Depending upon the size of the features 510, a milling process or laser etching process may also be used to create these features 510. For example, a series of controlled-depth laser slices that are angled along the planes of each of the surfaces A, B, and C will create the illustrated pyramid features 510. In like manner, a V-shaped bit may be used to mill the pairs of surfaces A-A, B-B, C-C, of the features 510, the slope of the V-shaped bit being based on the emission field pattern of the light emitting device.

Although the illustrated example features 510 are equilateral pyramids, one of skill in the art will recognize that irregular shaped pyramids may be formed, as well. Such irregular shapes may be used, for example, to provide multiple slopes to accommodate a multi-lobe emission field pattern.

Figure 6A:
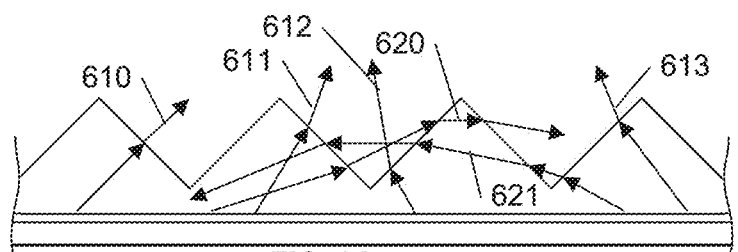
FIGS. 6A-6C illustrate example light paths, including light paths that re-enter the light emitting element.
Figure 6B:
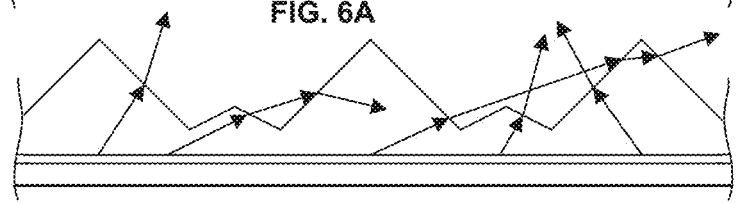
Figure 6C:
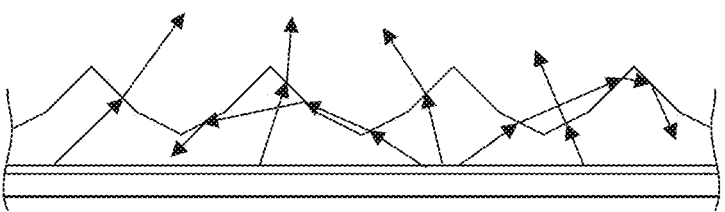

In some embodiments, particularly those with relatively steep slopes, some of the light that exits the sloped surfaces may strike an adjacent sloped surface, and re-enter the light emitting device, as illustrated in FIGS. 6A-6C.

In FIG. 6A, for example, most of the light that exits the sloped surfaces will continue to travel away from the light emitting device, as illustrated by light paths 610, 611, 612, 613. Some of the light that exits the sloped surfaces, however, may strike an adjacent surface, and re-enter the light emitting device, as illustrated by light paths 620, 621. Depending upon how the light strikes the adjacent surface, it may strike the next sloped surface at an angle within the critical angle, and exit that sloped surface, as illustrated by light path 620. However, the light may again re-enter the light emitting device, and some of the light may be directed back toward the light emitting layer, and may eventually be absorbed, as illustrated by light path 621.

The likelihood of the light re-entering the light emitting device will be dependent upon the particular arrangement of features. The features illustrated in FIGS. 6B and 6C, for example, will exhibit a lower likelihood of light re-entering the light emitting device, because of the larger separation between the steeper slopes, although some re-entry may occur.

In some embodiments of this invention, the surface features are formed to reduce both total internal reflection and reentry of light that exits the surface. As illustrated in FIG. 4A, if the sloped surfaces of the features face each other in close proximity, the likelihood of light re-entering an adjacent feature may be significant. Although some of the re-entering light may exit the adjacent feature, at least some of this re-entering light is likely to be absorbed within the light emitting device.

Figure 7:
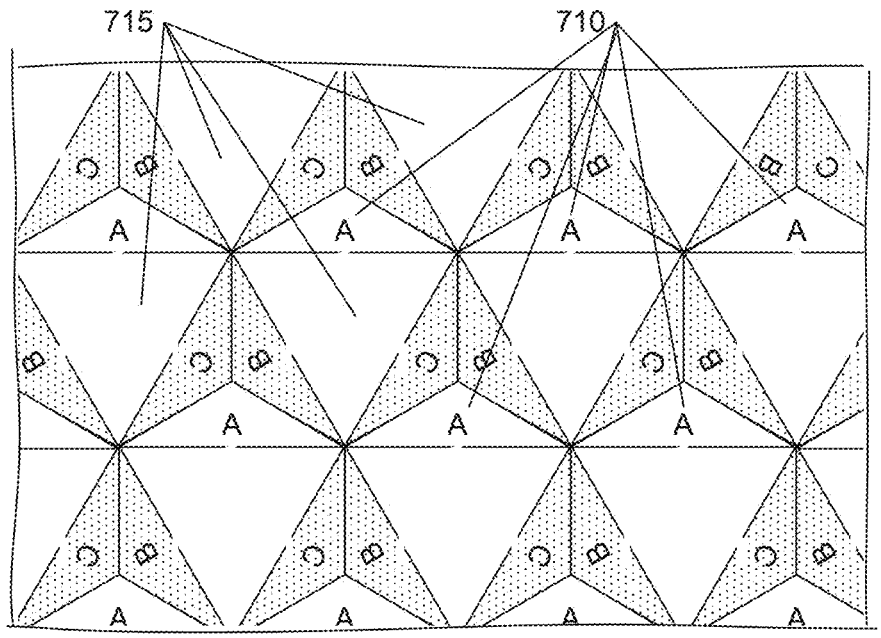
FIGS. 7-10 illustrate example arrangements of surface features that reduce the likelihood of light re-entering the light emitting element.

FIG. 7 illustrates an example alternative arrangement of the features 510 of FIG. 5A. In this example, some of the features 510 of FIG. 5A are not formed, thereby providing space 715 between the formed features 710 of FIG. 7. This additional spacing reduces the likelihood of light re-entering the neighboring features 710, because only very shallow-angled light will be below the height of the neighboring feature 710 after traveling this longer distance.

Additionally, in the example of FIG. 7, two similar surfaces do not directly face each other. In the example of FIG. 5A, each surface A faced a similar surface A; each surface B faced a similar surface B; and each surface C faced a similar surface C. For the purposes of this disclosure, two surfaces are said to be directly facing each other if a normal from each of the surfaces lie in a common plane, or lie within an angle of ten percent of a common plane.

In the example of FIG. 7, the surface areas that are in the path of light emitted from surface A include only the sloped surfaces B and C of two neighboring features 710. A normal from surface A will not lie within ten percent of either plane of a normal to surface B or C. Light from surface A that strikes surface B or C will re-enter the neighboring feature, but less light from surface A is likely to strike surface B or C, because these sloped surfaces B and C form a "valley" (or void) through which light emitted from surface A may travel unimpeded. A similar analysis with respect to each of surfaces B and C will show similar valleys for unimpeded light propagation from these surfaces.

A potential drawback of the arrangement of features 710 on the surface 700, however, may be the areas 715 of the surface 700 that remain flat. If the emission field pattern includes a lobe at or near normal to the light emitting surface, these flat spaces 715 will facilitate the exit of light of that lobe, but if the emission field pattern indicates that very little light is emitted normal to the light emitting surface, such as pattern 140 of FIG. 1, these flat spaces will increase the likelihood of light from the light emitting device being totally internally reflected. This total internal reflection may be reduced by roughening these flat spaces 715, although such roughening may introduce some re-injection of light as mentioned above.

Figure 8:
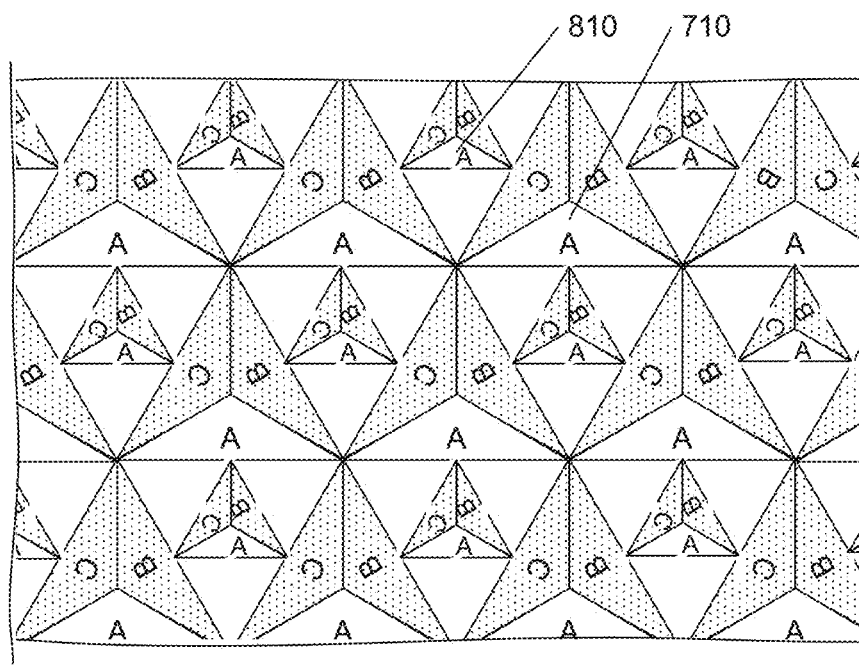

One technique for reducing the amount of non-sloped surfaces is to include additional features 810 within the spaces 715 between the major features 710, as illustrated in the example of FIG. 8. In this example, each surface A, B, C of the features 710 faces the edge of the surface pairs B-C, C-A, and A-B of the features 810, respectively. Although the additional features 810 interfere with the aforementioned "valleys" produced by the sloped surfaces B and C for light emitted from surface A, the reduced height of these smaller features 810 decreases the likelihood that light emitted from surface A of the features 710 will strike the surfaces of the features 810.

In some embodiments, the major 710 and minor 810 features may be inverses of each other. That is, the major features 710 may be pyramids that extend up from the surface, while the minor features 810 may be pits that extend down below the surface, or vice versa, as illustrated in FIG. 3B. In like manner, any of the particular features in any of the figures may be pits in lieu of pyramids; for example, every other row of features may be an inverse of the adjacent row. These and other variations will be evident to one of skill in the art in view of this disclosure.

Figure 9:
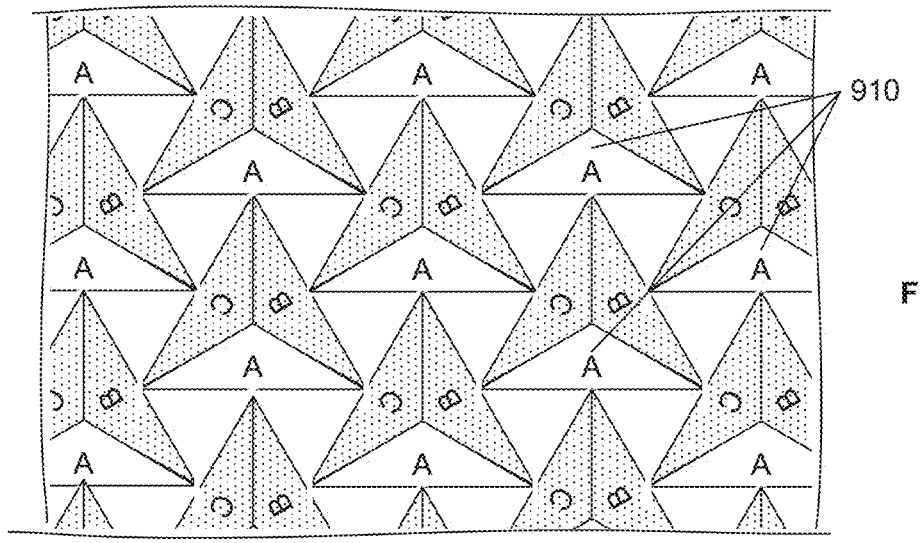

FIG. 9 illustrates an example alternative arrangement of features 910 that reduces the amount of unsloped surface areas, for emission field patterns that may not have a significant lobe at or near normal to the light emitting surface. As in the example arrangement of features 710, the features 910 are arranged such that no two surfaces directly face each other.

Figure 10:
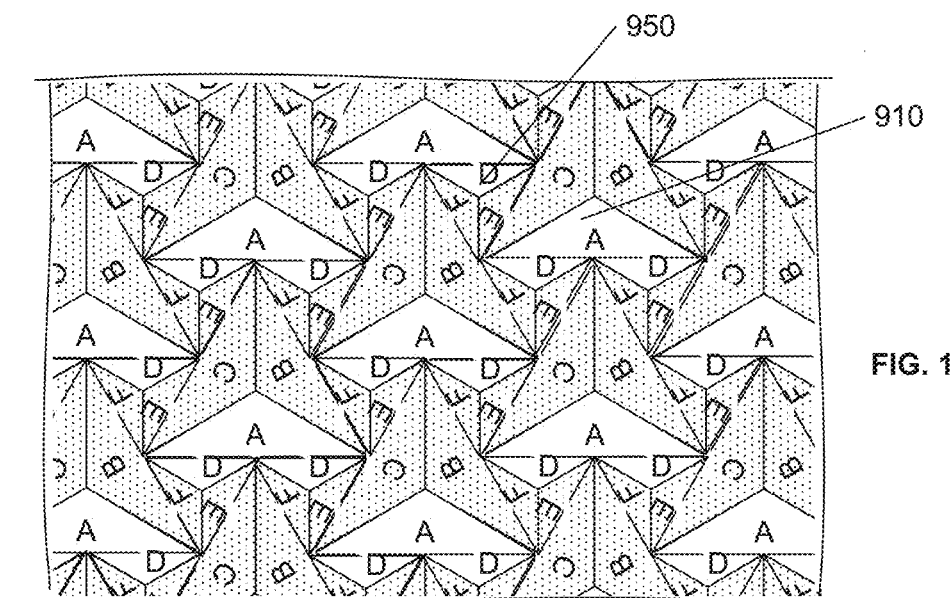

FIG. 10 illustrates an addition of other features 950 with sloped surfaces D, E, F, that may be the same or different from the slope of surfaces A, B and C. These additional features further increase the non-sloped areas on the escape surface. In this example embodiment, if the features 950 are designed for accommodating a second lobe in the emission field pattern, and the slopes of the surfaces D, E, F are relatively slight, such as under 30 degrees, the likelihood of light re-entering the light emitting device through features 910, 950 may also be relatively slight, even though the surface A directly faces (smaller) surfaces D, surface B faces surfaces F, and surface C faces surfaces E. Even if the surfaces D, E, F are at the same slope as the surfaces A, B, C, the 'valleys' produced by the sloped surfaces and the reduced height of the features 950 substantially reduce the likelihood of emitted light re-entering the features 910, 950, as compared to the example arrangement illustrated in FIGS. 5A-5B.

While the invention has been illustrated and described in detail in the drawings and foregoing description, such illustration and description are to be considered illustrative or exemplary and not restrictive; the invention is not limited to the disclosed embodiments.

Figure 11:
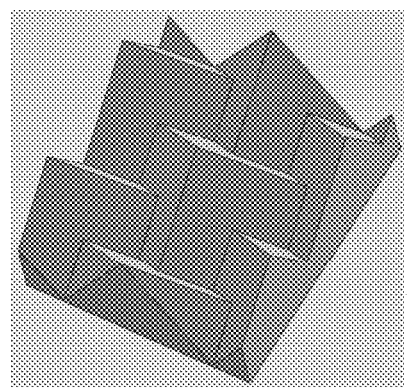
FIG. 11 illustrates an example escape surface comprising a pseudo random arrangement of surfaces.

For example, although pyramid shapes are used in these examples, other shapes may be used as well. FIG. 11 illustrates an example surface comprising a pseudo random arrangement of a variety of surfaces at different angles, suitable, for example, for a light emitting device having a multi-lobe emission field pattern.

Figure 12:
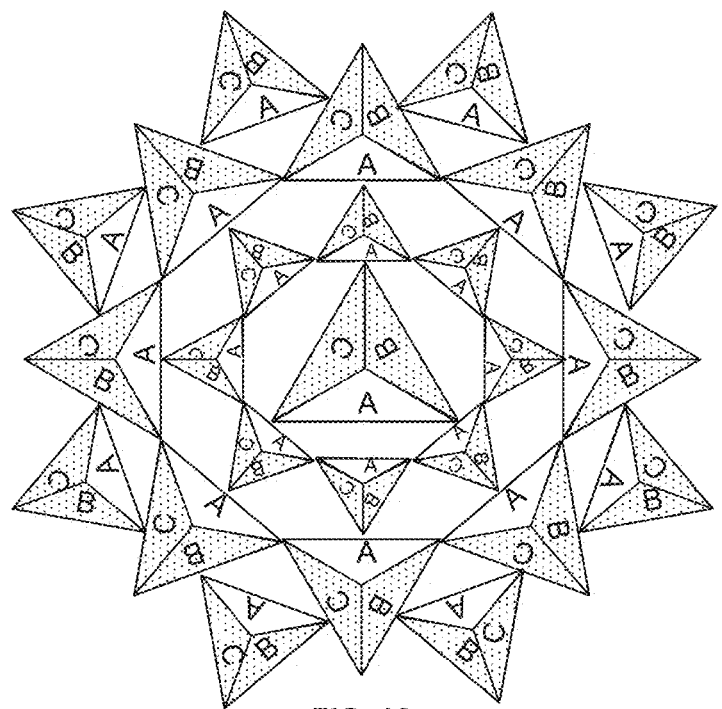
FIG. 12 illustrates an example escape surface comprising a circular arrangement of features.

In like manner, FIG. 12 illustrates an example surface comprising a plurality of features arranged in a circular-like pattern. This example also illustrates the use of different sized features.

Other variations to the disclosed embodiments can be understood and effected by those skilled in the art in practicing the claimed invention, from a study of the drawings, the disclosure, and the appended claims. For example, the use of sloped surfaces for improving light extraction efficiency may be combined with other techniques for improving light extraction efficiency, including, for example, roughening some or all of the surface features.

As noted above, the preferred slopes of the features on the escape surface may be determined based on a given angular emission field pattern, or a preferred angular emission field pattern may be determined based on the slopes of the features on the escape surface, or both the slope of the features and the angular emission field pattern may be determined in unison with each other to optimize the light extraction efficiency based on the combination of a select angular emission field pattern and select slopes of the features on the escape surface. For ease of reference, the phrase "slopes corresponding to the emission field pattern" is intended to be independent of any particular order of determining the slopes or the emission field pattern.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting element, comprising:
a first region of a first dopant type;
a second region of a second dopant type different from the first dopant type;
a light emitting layer sandwiched between the first region and the second region;
an escape surface formed in the first region; and
a mirror formed at a distance from the light emitting layer, the mirror being configured to reflect light from the light emitting layer toward the escape surface, wherein:
each of the first and the second regions comprising one or more layers;
the light emitting layer and the mirror have a relative distance of 0.3 to 1 so that:
the light emitting element is configured to emit a light with an angular emission field pattern relative to a surface of the light emitting layer; and
the angular emission field pattern comprises at least one lobe at a peak emission angle that is between about 20 and 75 degrees relative to the surface of the light emitting layer;
wherein the relative distance is defined as $d=\eta*D/\lambda$, $\eta$ is the index of refraction of the material between the active layer and the mirror, distance D is a distance between the light emitting layer and the mirror, and $\lambda$ is the wavelength of the emitted light;

the escape surface defines conic features; and each conic feature comprises a predominant slope that is substantially orthogonal to the peak emission angle.

2. The light emitting element of claim 1, wherein the predominant slope is biased from the peak emission angle toward angles of greater emission.

3. The light emitting element of claim 2, wherein the predominant slope is biased to maximize an amount of light that strikes the predominant slope within its escape zone.

4. The light emitting element of claim 1, wherein the conic features comprise conic pits or conic structures.

5. The light emitting element of claim 4, wherein the conic features are arranged in an array with a periodic or pseudo-periodic pattern.

6. The light emitting element of claim 5, wherein a proportion of the escape surface with the predominant slope is proportional to a proportion of a total power associated with the lobe.

\* \* \* \* \*